United States Patent
Ono et al.

(10) Patent No.: US 9,412,622 B2
(45) Date of Patent: Aug. 9, 2016

(54) EPITAXIAL SILICON WAFER AND METHOD FOR MANUFACTURING SAME

(71) Applicant: SUMCO CORPORATION, Tokyo (JP)

(72) Inventors: Toshiaki Ono, Tokyo (JP); Shigeru Umeno, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 14/781,709

(22) PCT Filed: Oct. 9, 2013

(86) PCT No.: PCT/JP2013/006021
§ 371 (c)(1),
(2) Date: Oct. 1, 2015

(87) PCT Pub. No.: WO2014/162373
PCT Pub. Date: Oct. 9, 2014

(65) Prior Publication Data
US 2016/0042974 A1 Feb. 11, 2016

(30) Foreign Application Priority Data
Apr. 3, 2013 (JP) ................................. 2013-077411

(51) Int. Cl.
| | | |
|---|---|---|
| *H01L 29/30* | (2006.01) | |
| *H01L 21/322* | (2006.01) | |
| *C30B 29/06* | (2006.01) | |
| *C30B 15/20* | (2006.01) | |
| *C30B 15/04* | (2006.01) | |
| *C30B 33/02* | (2006.01) | |
| *H01L 29/16* | (2006.01) | |
| *H01L 29/36* | (2006.01) | |

(52) U.S. Cl.
CPC ............ *H01L 21/3225* (2013.01); *C30B 15/04* (2013.01); *C30B 15/206* (2013.01); *C30B 29/06* (2013.01); *C30B 33/02* (2013.01); *H01L 29/16* (2013.01); *H01L 29/36* (2013.01)

(58) Field of Classification Search
CPC . H01L 21/3221; H01L 21/3225; H01L 29/36; H01L 29/16
USPC .......................................................... 257/617
See application file for complete search history.

(56) References Cited

U.S. PATENT DOCUMENTS

| | | | | |
|---|---|---|---|---|
| 6,336,968 | B1 * | 1/2002 | Falster | .................. C30B 15/206 117/2 |
| 7,732,352 | B2 * | 6/2010 | Mun | ..................... H01L 21/324 117/2 |
| 7,846,253 | B2 | 12/2010 | Koike | |
| 2011/0052923 | A1 | 3/2011 | Umeno et al. | |
| 2012/0043644 | A1 | 2/2012 | Ono et al. | |

FOREIGN PATENT DOCUMENTS

| | | |
|---|---|---|
| EP | 1887110 | 2/2008 |
| JP | 2010-228924 | 10/2010 |
| JP | 2010-228931 | 10/2010 |
| JP | 2010-251471 | 11/2010 |
| JP | 2011-054821 | 3/2011 |
| WO | 2010/109873 | 9/2010 |

OTHER PUBLICATIONS

International Search Report issued in PCT/JP2013/006021, dated Nov. 12, 2013, along with an English language translation.

* cited by examiner

*Primary Examiner* — Theresa T Doan
(74) *Attorney, Agent, or Firm* — Greenblum & Bernstein, P.L.C.

(57) ABSTRACT

An epitaxial silicon wafer cut from a silicon single crystal grown by the Czochralski method, and having a diameter of 300 mm or more. In this epitaxial silicon wafer, the time required to cool every part of the silicon single crystal during the growth from 800° C. down to 600° C. is set to 450 minutes or less, the interstitial oxygen concentration is from $1.5 \times 10^{18}$ to $2.2 \times 10^{18}$ atoms/cm$^3$ (old ASTM standard), the entire surface of the cut silicon wafer is composed of a COP region, and the BMD density in the bulk of the epitaxial wafer after a heat treatment at 1000° C. for 16 hours is $1 \times 10^4$/cm$^2$ or less. In this epitaxial silicon wafer, even if the thermal process in a semiconductor device fabrication process is a low temperature thermal process, epitaxial defects do not occur, as well as sufficient gettering capability being obtainable.

4 Claims, No Drawings

EPITAXIAL SILICON WAFER AND METHOD FOR MANUFACTURING SAME

TECHNICAL FIELD

The present invention relates to an epitaxial silicon wafer and a method of producing the same, and more particularly to an epitaxial silicon wafer and a method of producing the same, suitable for a low temperature device process.

BACKGROUND ART

In the process of fabricating semiconductor devices, gettering techniques are employed in order to avoid property degradation resulting from contamination of heavy metals, such as Fe (iron) and Ni (nickel). Gettering is a technique that introduces a heavy metal atom into a gettering site in a semiconductor substrate, and keeps low the heavy metal concentration in the vicinity of the semiconductor substrate surface serving as a device active region. A bulk micro defect (BMD) that is grown from oxygen precipitate nuclei contained in the semiconductor substrate is utilized as the gettering site. In a semiconductor device fabrication process (device process), the BMD is grown in a process (thermal process) in which the semiconductor substrate is heated.

In recent years, however, circuit pattern miniaturization of semiconductor devices has progressed, and with such a circuit pattern miniaturization, the thermal processes in the fabrication of the semiconductor devices have been performed at lower temperatures. The thermal process, for example, at or below 1000° C. is in some cases employed. In such a low temperature thermal process, the growth of precipitate nuclei cannot be expected, and the gettering capability of the semiconductor substrate is low.

In order to solve this problem, a semiconductor substrate doped with nitrogen or carbon is in some cases used. By doping the nitrogen or carbon to the semiconductor substrate, the precipitate nuclei are apt to grow even in the low temperature thermal process. Such a semiconductor substrate can be obtained by cutting from a silicon single crystal grown from a silicon melt to which the nitrogen or carbon is added.

When an epitaxial layer is formed on the surface of the semiconductor substrate, the process of forming the epitaxial layer is performed at high temperatures and therefore, if the nitrogen or carbon has not been doped, oxygen precipitate nuclei in the semiconductor substrate are lost, and BMDs are not formed in the device process. In contrast to this, when the nitrogen or carbon has been doped in the semiconductor substrate, the BMD is grown in the epitaxial layer formation process and the device process.

In this method, however, due to segregation during pulling of a silicon single crystal, the concentration of nitrogen or carbon varies greatly between the upper and lower portions of the silicon single crystal, and following this, the density of oxygen precipitates also greatly varies. Because of this, of one silicon single crystal rod, a portion where the BMD of appropriate density and size is obtained is extremely small in amount.

In the device process, a method of forming oxygen precipitates in a semiconductor substrate (instead of doping the nitrogen or carbon) in which a semiconductor substrate (wafer) of high oxygen concentration is prepared to pre-anneal the substrate before the formation of the epitaxial layer has been proposed as another method of stably growing oxygen precipitates (BMD) that could be a gettering site.

For example, Patent Literature 1, described below, discloses a method of producing an epitaxial wafer, in which a wafer is cut from a silicon single crystal having an oxygen concentration from $18 \times 10^{17}$ to $21 \times 10^{17}$ atoms/cm$^3$, and this wafer is heat treated (pre-annealed) at a temperature of 750° C. to 850° C. for 20 minutes or more to 50 minutes or less, and the epitaxial growth for this wafer is provided. Oxygen precipitate nuclei formed in the wafer by this method are not lost during the formation of the epitaxial layer. In this wafer, for example, in a region having a thickness of about 10 μm immediately below the epitaxial layer, oxygen precipitate nuclei of high density are formed and grows in the device process.

However, the pre-annealing process is requisite for such a method and therefore, production costs are increased accordingly.

Incidentally, an epitaxial layer is used as a device active region where a diode, transistor and the like are to be formed and therefore, when a dislocation occurs in this region, in some cases, degradation of electrical characteristics of the device (for example, leakage failure) occurs. In this case, the yield of the device is reduced. When the oxygen precipitates of high density are present immediately below the epitaxial layer, as described in Patent Literature 1, described below, and if a dislocation occurs resulting from the oxygen precipitates, the dislocation easily reaches the epitaxial layer serving as a device active region, causing epitaxial defects, thereby degrading the electrical characteristics of the device. Further, when BMDs of large size grow, the strength of the wafer is degraded.

Patent Literatures 2 and 3 described below, as a method of avoiding the above described epitaxial defect problems, disclose techniques in which a wafer is solution treated at high temperatures to cause the oxygen precipitate nuclei to be lost, and thereby to restrain the formation of the BMD.

However, the methods of the Patent Literatures 2 and 3, described below, are such that even if the gettering capability is lost, the amount of the BMD is reduced, so that epitaxial defects will not be introduced. Therefore, in the device process in which heavy metal contamination could occur, wafers produced in these methods can not be used.

CITATION LIST

Patent Literature

Patent Literature 1: Japanese Patent Application Publication No. 2011-054821
Patent Literature 2: Japanese Patent Application Publication No. 2010-228931
Patent Literature 3: Japanese Patent Application Publication No. 2010-228924

SUMMARY OF INVENTION

Technical Problem

An object of the present invention is, therefore, to provide an epitaxial silicon wafer in which even if the thermal process in a semiconductor device fabrication process is a low temperature thermal process, epitaxial defects do not occur, as well as sufficient gettering capability being obtainable.

Another object of the present invention is to provide a method of producing an epitaxial silicon wafer in which even if the thermal process in a semiconductor device fabrication process is a low temperature thermal process, epitaxial defects do not occur, as well as sufficient gettering capability being obtainable.

Solution to Problem

The gist of the present invention is that an epitaxial silicon wafer of items (1) and (2) below and a method of producing the epitaxial silicon wafer of items (3) and (4) below.

(1) An epitaxial silicon wafer cut from a silicon single crystal grown by the Czochralski method, having a diameter of 300 mm or more, and having an epitaxial layer formed on a surface thereof,
wherein a time required to cool every part of the silicon single crystal during the growth from 800° C. down to 600° C. is set to 450 minutes or less,
an interstitial oxygen concentration is from $1.5 \times 10^{18}$ to $2.2 \times 10^{18}$ atoms/cm$^3$ (old ASTM standard),
a nitrogen concentration is $1 \times 10^{13}$ atoms/cm$^3$ or less,
a carbon concentration is $1 \times 10^{16}$ atoms/cm$^3$ or less,
an entire surface of the cut silicon wafer is composed of a COP region, and a BMD density in the bulk of the epitaxial wafer is $1 \times 10^4$/cm$^2$ or less after a heat treatment at 1000° C. for 16 hours.

(2) The epitaxial silicon wafer according to the above described item (1),
wherein the wafer is heat treated at 1000° C. or less, and then is subjected to a thermal stress test by a flash lamp anneal process at a maximum attainable temperature of 1200° C. and thereafter, dislocation etch pits do not occur even after the wafer is subjected to Wright etching.

(3) A method of producing the epitaxial silicon wafer, according to the above described item (1), comprises the steps of:
growing a silicon single crystal by the Czochralski method and of setting to 450 minutes or less the time required to cool every part of the silicon single crystal from 800° C. down to 600° C.;
removing an OSF-ring region in an outer periphery of the silicon single crystal;
cutting a silicon wafer of 300 mm or more in diameter from the silicon single crystal having the OSF-ring region removed; and
forming an epitaxial layer on the surface of the silicon wafer,
wherein the step of growing the silicon single crystal includes a step of growing a silicon single crystal by causing a region within a radius of at least 150 mm from the center axis of the silicon single crystal to be only a COP region, and
wherein the step of removing the OSF-ring region includes a step of removing an OSF-ring so that only the COP region remains in the radial direction of the silicon single crystal.

(4) The method of producing the epitaxial silicon wafer, according to the above described item (3),
wherein the step of forming the epitaxial layer includes a step of heating the silicon wafer so that oxygen precipitate nuclei are reduced.

Advantageous Effects of Invention

When an inventive epitaxial silicon wafer is used in a device thermal process at 1000° C. or less, the oxygen precipitates of size that affects the creation of epitaxial defects and the strength of wafer, do not grow in the wafer; however oxygen precipitates of extremely small size (of a count (density) where sufficient gettering capability can be obtained) are formed.

DESCRIPTION OF EMBODIMENTS

As described above, an epitaxial silicon wafer according to the present invention is an epitaxial silicon wafer cut from a silicon single crystal grown by the Czochralski method, having a diameter of 300 mm or more, and having an epitaxial layer formed on a surface thereof, wherein the time required to cool every part of the silicon single crystal during the growth from 800° C. down to 600° C. is set to 450 minutes or less, interstitial oxygen concentration is from $1.5 \times 10^{18}$ to $2.2 \times 10^{18}$ atoms/cm$^3$ (old ASTM standard), nitrogen concentration is $1 \times 10^{13}$ atoms/cm$^3$ or less, carbon concentration is $1 \times 10^{16}$ atoms/cm$^3$ or less, the entire surface of the cut silicon wafer is composed of a COP region, and the BMD density in the bulk of the epitaxial wafer is $1 \times 10^4$/cm$^2$ or less after the heat treatment at 1000° C. for 16 hours.

In this epitaxial silicon wafer, the BMD density in the bulk after the heat treatment at 1000° C. for 16 hours is $1 \times 10^4$ cm$^2$ or less, oxygen precipitate nuclei are substantially not present in this silicon wafer. Therefore, also in the device process, no BMD grows from the initial device process. When the thermal process of the device at 1000° C. or less is performed using this silicon wafer, nucleation occurs by means of oxygen precipitate nuclei caused by interstitial oxygen. These oxygen precipitate nuclei, however, do not grow to the size that affects the creation of epitaxial defects and the strength of wafer.

In addition, the gettering capability is ensured even if the oxygen precipitates are small in size, but if the density of the oxygen precipitates is high. Oxygen precipitates are formed from the interstitial oxygen by heating (for example, from 600° C. to 800° C.), according to the degree of supersaturation of oxygen. This epitaxial silicon wafer has an interstitial oxygen concentration from $1.5 \times 10^{18}$ to $2.2 \times 10^{18}$ atoms/cm$^3$ (old ASTM standard). From the interstitial oxygen of this concentration range, oxygen precipitates having a sufficient density for the gettering are formed even in the thermal process at 1000° C. or less. When the epitaxial silicon wafer has the interstitial oxygen concentration that is lower than this range, sufficient gettering capability can not be obtained, as will be described later. On the other hand, all oxygen having concentrations above this range can not be dissolved in the process of forming the epitaxial layer. In this case, BMDs grow from the initial device process, and there is a possibility of affecting the creation of epitaxial defects and the strength of wafer. The interstitial oxygen concentration is preferably from $1.5 \times 10^{18}$ to $1.9 \times 10^{18}$ atoms/cm$^3$ (old ASTM standard).

The reason that the oxygen precipitate of such size and density can be obtained is primarily that in the present invention, the entire surface of the wafer cut from a silicon single crystal (prior to forming an epitaxial layer) is only a crystal originated particle (COP) region (void defect region), and that the time required to cool every part of the silicon single crystal during the growth from 800° C. down to 600° C. is 450 minutes or less.

An OSF-ring region is present in an outer periphery of the silicon single crystal immediately after being grown (as grown). The OSF-ring region is a region having a defect referred to as an oxidation induced stacking fault (OSF), the region being present in ring-shaped fashion around the center in a cross-section perpendicular to the center axis (pulling axis) of the crystal. There are present in the OSF-ring region, oxygen precipitate nuclei of large size formed during the crystal growth. When a wafer includes the OSF-ring region, the oxygen precipitate nuclei present in this region, even if heated to high temperatures during formation of the epitaxial layer, are not lost and are turned into precipitates of large size in the device process.

A wafer cut from this silicon single crystal has a COP region in its entire surface and contains no OSF-ring region and therefore, in this wafer no epitaxial defects occur owing to oxygen precipitates originated from oxygen precipitate nuclei.

Also in the COP region of a wafer, if the wafer has been cut from a silicon single crystal that does not satisfy the requirement for "the time required to cool every part of the silicon single crystal during the growth from 800° C. down to 600° C. shall be 450 minutes or less," then oxygen precipitate nuclei are formed which are not lost during the formation of an epitaxial layer. Such oxygen precipitate nuclei further grow in the device process, causing the creation of epitaxial defects and the decrease in strength of the wafer.

Nitrogen and carbon are present within the silicon wafer—mainly taken in from the atmosphere in the production of a silicon single crystal. Concentrations of such (not intentionally added) nitrogen and carbon in the wafer are usually below the limit of detection, and specifically, they are $1\times10^{13}$ atoms/cm$^3$ or less, and $1\times10^{16}$ atoms/cm$^3$ or less, respectively. The nitrogen and carbon of such concentrations have no influence on the formation of oxygen precipitate nuclei. Therefore, when this epitaxial silicon wafer is used in the device process, epitaxial defects do not occur owing to precipitates resulting from the nitrogen and carbon in the silicon wafer.

This epitaxial silicon wafer can be produced by the following method. Namely, this production method that is a process of growing a silicon single crystal by the Czochralski method, comprises the steps of:

setting to 450 minutes or less the time required to cool every part of the silicon single crystal from 800° C. down to 600° C.;

removing an OSF-ring region in an outer periphery of the silicon single crystal;

cutting the silicon wafer of 300 mm or more in diameter from the silicon single crystal having the OSF-ring region removed, and;

forming an epitaxial layer on the surface of the silicon wafer.

In the process of growing the silicon single crystal, a region within at least 150 mm radius from the center axis of the silicon single crystal is caused to be only a COP region, to provide growth of a silicon single crystal.

In the step of removing the OSF-ring, the OSF-ring region is removed so that only the COP region remains in the radial direction of the silicon single crystal.

In order to grow a silicon single crystal causing a region within at least a radius of 150 mm from the center axis of the silicon single crystal to be only a COP region, a known method can be used in which, for example, the ratio V/G of the pulling rate V to the average value G of a temperature gradient within the crystal in the pulling axis direction, is adjusted to a suitable size.

According to such a method of producing such an epitaxial silicon wafer, nitrogen and carbon do not need to be intentionally doped in a silicon single crystal. Therefore, in the step of growing the silicon single crystal, the silicon melt does not need to be the one in which carbon or nitrogen is added and thus, the above described problems resulting from the segregation of nitrogen and carbon will not be created, thus achieving uniform density of oxygen precipitates throughout the entire silicon single crystal.

Removal of an OSF-ring region can be carried out by, for example, cylindrically grinding a silicon single crystal.

In the step forming an epitaxial layer, the epitaxial layer is preferably made to be grown so that its thickness is 1 μm or more. A silicon wafer cut from a silicon single crystal has a COP region in its entire surface. The COP region normally has recesses of extremely small size formed on the surface even after being polished; however, if the thickness of the epitaxial layer is 1 μm or more, a step surface reflecting such a recess is less likely to occur on the surface of the epitaxial layer.

In this production method, in the step of forming the epitaxial layer, the silicon wafer is preferably heated so that the oxygen precipitate nuclei are reduced.

In this case, even if the wafer cut from a silicon single crystal contains oxygen precipitate nuclei, such oxygen precipitate nuclei are dissolved by heating in the step of forming an epitaxial layer, and can be reduced (lost). For this purpose, the epitaxial layer is preferably formed at a temperature of 1000° C. to 1175° C. The dissolved oxygen re-forms oxygen precipitate nuclei of extremely small size when as described above, the silicon wafer is heated in the device process.

Such a method does not require pre-annealing required in the method in the above Patent Literature 1, namely, heating different from heating during formation of the epitaxial layer, and therefore, production costs can be reduced.

EXAMPLES

Example 1

Samples of epitaxial silicon wafers, shown in Table 1 were prepared. These samples are all obtained by subjecting to the process, as will be described later, the wafer cut from a silicon single crystal grown by the Czochralski method.

TABLE 1

| Sample No. | 800° C.-600° C. Residence time (min) | Interstitial oxygen concentration ($\times 10^{18}$ atoms/cm$^3$) | Nitrogen concentration ($\times 10^{13}$ atoms/cm$^3$) | Carbon concentration ($\times 10^{16}$ atoms/cm$^3$) | Thermal stress test | Gettering capacity | |
|---|---|---|---|---|---|---|---|
| 1 | 325 | 1.35* | Not doped | <1.0 | ○ | X | Comparative example |
| 2 | 325 | 1.52 | Not doped | <1.0 | ○ | ○ | Inventive example |
| 3 | 440 | 1.82 | Not doped | <1.0 | ○ | ○ | Inventive example |
| 4 | 440 | 2.15 | Not doped | <1.0 | ○ | ○ | Inventive example |
| 5 | 459* | 1.58 | Not doped | <1.0 | X | ○ | Comparative example |
| 6 | 468* | 2.08 | Not doped | <1.0 | X | ○ | Comparative example |
| 7 | 325 | 1.35* | 1.2* | <1.0 | ○ | X | Comparative example |

TABLE 1-continued

| Sample No. | 800° C.-600° C. Residence time (min) | Interstitial oxygen concentration ($\times 10^{18}$ atoms/cm$^3$) | Nitrogen concentration ($\times 10^{13}$ atoms/cm$^3$) | Carbon concentration ($\times 10^{16}$ atoms/cm$^3$) | Thermal stress test | Gettering capacity | |
|---|---|---|---|---|---|---|---|
| 8 | 325 | 1.64 | 1.5* | <1.0 | X | ○ | Comparative example |
| 9 | 424 | 1.51 | 0.8 | <1.0 | ○ | ○ | Inventive example |
| 10 | 424 | 2.16 | 0.3 | <1.0 | ○ | ○ | Inventive example |
| 11 | 440 | 1.81 | Not doped | 1.4* | X | ○ | Comparative example |
| 12 | 440 | 2.07 | Not doped | 9.4* | X | ○ | Comparative example |

Note:
An asterisk (*) indicates a value that is out of range specified in the present invention.

In Table 1, "800° C.-600° C. Residence time" means "the time required to cool every part of a silicon single crystal from 800° C. down to 600° C. during the growth of the silicon single crystal." This required (residence) time was altered, during the growth of the silicon single crystal, by changing the size and shape of a carbon cylindrical heat-shield body (carbon parts) being disposed around the silicon single crystal and having heat insulation effectiveness.

Before cutting wafers, the outer peripheral portion of the silicon single crystal was removed by cylindrical grinding. The diameters of the cut wafers are all set to about 300 mm.

In Table 1, the interstitial oxygen concentration, and the carbon concentration are values obtained by analyzing the wafer by Fourier transform infrared spectroscopy (FTIR). The description "<1.0" in terms of the carbon concentration in Samples 1 to 10 indicates that the carbon concentration of a corresponding sample is below the lower limit of detection ($1.0 \times 10^{16}$ atoms/cm$^3$). For Samples 7 to 10, the nitrogen concentration indicates values determined by segregation calculation from the amount of nitrogen doped in the silicon melt when a silicon single crystal is grown. In terms of Samples 1 to 6, 11 and 12, the nitrogen has not been intentionally doped, and the nitrogen concentrations of these samples are thought to be below $1 \times 10^{13}$ atoms/cm$^3$, which is the lower limit of detection.

Whether an OSF-ring region was included was examined for each wafer by the following method. That is, the wafer was heat treated at 1100° C. for 16 hours in a dry $O_2$ atmosphere and thereafter, a portion of the wafer surface, 2 μm in thickness, was removed by Wright etch and thereafter, the density of OSF defects was measured. As a result, the density of OSF defects for any wafer was less than $1 \times 10^2$/cm$^2$. This result indicates that any one of these wafers does not include the OSF-ring region, and that the entire surface of the wafer is the COP region.

Thereafter, an epitaxial layer of a thickness of 3 μm is formed at 1100° C. on these wafers, and an epitaxial silicon wafer was obtained.

Through simulations of the low temperature heat processes in the device process, this epitaxial silicon wafer was heat treated by the following four times of heating and cooling (first to fourth step). The heating and cooling rates were both set to 5° C./min.

First step: retained at 650° C. for 100 minutes
Second step: retained at 900° C. for 20 minutes
Third step: retained at 825° C. for 30 minutes
Fourth step: retained at 725° C. for 100 minutes The epitaxial silicon wafer obtained (hereinafter referred to as "Sample") was assessed in terms of the thermal stress test and the gettering capability. Samples 2 to 4, 9 and 10 are examples of the present invention, while Samples 1, 5-8, 11 and 12 are comparative examples that do not satisfy the requirements of the present invention.

With respect to each sample, millisecond annealing was performed as the thermal stress test consecutively five times at a maximum attainable temperature of 1200° C. using a flash lamp annealing heat treatment furnace. Thereafter, Wright etching was performed on the sample surface to visually check the presence or absence of dislocation etch pits on the sample surface. In the column "thermal stress test" in Table 1, samples in which the dislocation etch pits were observed (the results of the thermal stress test were not good) are indicated by "x", while those in which the dislocation etch pits were not observed (the results of the thermal stress test were good) are indicated by "603". For samples in which the dislocation etch pits were observed, a large warp occurs in the wafer.

In order to assess the gettering capability, the back side of the sample was intentionally contaminated with Ni so as to have a density of $1 \times 10^{12}$/cm$^2$, and this sample was heat treated (drive-in heat treatment) for diffusion at 900° C. for 10 minutes. Thereafter, the portion of 2 μm in thickness of the sample surface was removed by Wright etch, to verify the presence of a shallow pit that is a shallow recess of extremely small size in the surface.

The Ni, if not incorporated into the gettering sites (oxygen precipitates), is combined with silicon to form a Ni silicide. The Ni silicide is dissolved by Wright etch, thereby forming shallow pits in the sample surface; thus, it can be determined that a sample having the shallow pits formed therein had low gettering capability for Ni. In the column "gettering capability" in Table 1, samples in which the shallow pits were verified (the gettering capability was low) are indicated by "x," while those in which the shallow pits were not verified (the gettering capability was high) are indicated by "○".

Of Samples 1 to 4, those in a condition in which they were not subjected to other processes (As-Epi) after the formation of an epitaxial layer, were heated at 1000° C. for 16 hours and even thereafter, BMDs were not detected (the lower limit of detection is $1 \times 10^4$/cm$^2$). If the oxygen precipitate nuclei are present in a condition in which the samples were not subjected to other processes after the formation of the epitaxial layer, the oxygen precipitate nuclei are thought to be grown by heating at 1000° C. for 16 hours; thus, it is considered that the oxygen precipitate nuclei were not substantially present in Samples 1 to 4. This is thought to be because, due to the heating during the formation of the epitaxial layer, the oxygen precipitate nuclei formed during the growth of the silicon single crystal were dissolved.

The results of the thermal stress tests for Samples 1 to 4 were good. When these samples were observed under a transmission electron microscope (TEM), plate-shaped oxygen precipitates having a size of 100 nm or less were verified. Due to the fact that the oxygen precipitates were of extremely small size in this way, dislocations are not considered to have occurred. In addition, such oxygen precipitates of extremely small size are not to degrade the strength of the wafer.

On the other hand, the gettering capability was high in Samples 2 and 3, but it was low in Sample 1. This was thought to be because the interstitial oxygen concentration was lower in Sample 1 in comparison to Samples 2 to 4 (less than $1.5 \times 10^{18}$ atoms/cm$^3$) and therefore, the oxygen precipitates of sufficient density were not formed as a getter of the Ni. Samples 2 to 4 can be said to have an optimal oxygen supersaturation in that these samples form oxygen precipitates of concentration sufficient for the gettering of Ni, Samples 5 and 6 are longer than the other samples in terms of "the time required to cool every part of a silicon single crystal from 800° C. down to 600° C. during the growth of the silicon single crystal," and exceeds 450 minutes. For Samples 5 and 6, their gettering capabilities were high, but the results of their thermal stress tests were not good.

Of these samples, those in a condition in which they were not subjected to other processes after the formation of the epitaxial layer, were heated at 1000° C. for 16 hours and then, the BMD was detected at a density of $2.5 \times 10^5$/cm$^2$. Since the formation of oxygen precipitate nuclei and their growths are promoted in a temperature range of 600° C. to 800° C., it is considered that in these samples, the oxygen precipitate nuclei formed during the growth of crystal grew without being dissolved during the formation of the epitaxial layer and thus, the oxygen precipitate nuclei further grew by being heated at 1000° C. for 16 hours.

Samples 7 and 8 are those doped with the nitrogen at more than $1 \times 10^{13}$ atoms/cm$^3$. In Sample 7, the interstitial oxygen concentration is less than the $1.5 \times 10^{18}$ atoms/cm$^3$, whereas in sample 8, it is $1.5 \times 10^{18}$ atoms/cm$^3$ or more.

In Sample 7, the result of the thermal stress test was good, but the gettering capability was low. In Sample 8, the gettering capability was high, but the result of the thermal stress test was not good. This is thought to be due to the fact that Sample 8 was high in interstitial oxygen concentration in comparison to Sample 7 and therefore, the sizes of the oxygen precipitates were increased.

Samples 9 and 10 are those doped with the nitrogen at a concentration lower than $1 \times 10^{13}$ atoms/cm$^3$, and the results of their thermal stress tests were good, and their gettering capabilities were high. Given this level of nitrogen concentration, the effect of increasing the sizes of the oxygen precipitates is not noticeable, and slip dislocation is not considered to have occurred.

Samples 11 and 12 are those doped with carbon at a concentration higher than $1 \times 10^{16}$ atoms/cm$^3$, and their gettering capabilities were high, but the results of their thermal stress tests were not good. Of these samples, those in a condition in which they were not subjected to other processes after the formation of the epitaxial layer, were heated at 1000° C. for 16 hours and even thereafter the BMD was not detected. Therefore, the oxygen precipitate nuclei are thought to have been dissolved during the formation of the epitaxial layer.

However, by doping with carbon, very stable BMD nuclei are formed for a very short time in the low temperature thermal process. During the thermal stress test, higher compressive stress occurs as closer to the surface of the wafer. The reason that the results of the thermal stress tests in Samples 11 and 12 were not good is thought to be that, of the oxygen precipitate nuclei grown from the very stable oxygen precipitate nuclei formed in the low temperature thermal process, those present near the surface of the wafer caused the slip dislocation to occur.

Example 2

Table 2 shows the results of the thermal stress tests for a sample containing no OSF-ring region and samples containing the OSF-ring region. As shown in Table 2, Sample 3 described in Example 1 was employed as the sample containing no OSF-ring region.

TABLE 2

| Sample No. | 800° C.-600° C. Residence time (min) | Interstitial oxygen concentration ($\times 10^{18}$ atoms/cm$^3$) | Nitrogen concentration ($\times 10^{13}$ atoms/cm$^3$) | Carbon concentration ($\times 10^{16}$ atoms/cm$^3$) | OSF maximum density (/cm$^2$) | Thermal stress test |
|---|---|---|---|---|---|---|
| 3  | 440 | 1.82 | Not doped | <1.0 | $<1 \times 10^2$ | ○ |
| 14 | 440 | 1.62 | Not doped | <1.0 | $2.50 \times 10^2$ | X |
| 15 | 440 | 1.95 | Not doped | <1.0 | $3.60 \times 10^3$ | X |
| 16 | 440 | 1.87 | 0.5       | <1.0 | $7.30 \times 10^3$ | X |

In Samples 14 to 16, the wafer contains the OSF-ring region, and in this respect, it does not satisfy the requirements of the present invention. Except for this point, the methods of preparing Samples 14 to 16 are the same as those in Example 1. Verification of whether a sample contains the OSF-ring region was made in the same way as in Example 1. In Samples 14 to 16, the OSF-ring region was present in a region of 10 mm to 30 mm from the outer periphery of the wafer. For these samples, the same thermal stress test as in Example 1 was conducted.

Samples 14 to 16 satisfies the requirements of the present invention, in terms of "the time required to cool every part of the silicon single crystal during the growth from 800° C. down to 600° C.," interstitial oxygen concentration, nitrogen concentration, and carbon concentration.

Sample 3 contained no OSF-ring region, and the results of the thermal stress test were good, as described above (Example 1). In contrast to this, for Samples 14 to 16, their thermal stress tests showed that dislocation etch pits occurred in the OSF-ring region, the pits being considered to be due to a slip dislocation resulting from the oxygen precipitates.

In comparison to the results of Example 1, Samples 14 to 16 can be said to have been optimized in terms of interstitial oxygen concentration (oxygen supersaturation). However, it was revealed that if the OSF-ring region was present even in such samples, the slip dislocation occurred in the region.

INDUSTRIAL APPLICABILITY

When this epitaxial silicon wafer is used in the device thermal process at 1000° C. or less, the oxygen precipitates of size that influences the creation of epitaxial defects and the strength of wafer, do not grow, but oxygen precipitates of the density that can obtain sufficient gettering capability are formed. Therefore, this epitaxial silicon wafer is suitable for use in the low temperature device process.

What is claimed is:

1. An epitaxial silicon wafer comprising:
a cut silicon wafer, which was cut from a silicon single crystal grown by the Czochralski method and has a diameter of 300 mm or more, and
an epitaxial layer formed on a surface of the cut silicon wafer; wherein
a time required to cool every part of the silicon single crystal from 800° C. down to 600° C. during the growth is set to 450 minutes or less,
an interstitial oxygen concentration of the cut silicon wafer is from $1.5 \times 10^{18}$ to $2.2 \times 10^{18}$ atoms/cm$^3$ (old ASTM standard),
a nitrogen concentration of the cut silicon wafer is $1 \times 10^{13}$ atoms/cm$^3$ or less,
a carbon concentration of the cut silicon wafer is $1 \times 10^{16}$ atoms/cm$^3$ or less,
an entire surface of the cut silicon wafer is composed of a COP region, and
a BMD density in a bulk of the epitaxial silicon wafer is $1 \times 10^4$/cm$^2$ or less after a heat treatment at 1000° C. for 16 hours.

2. The epitaxial silicon wafer according to claim 1, wherein the epitaxial silicon wafer is heat treated at 1000° C. or less, and then is subjected to a thermal stress test by a flash lamp anneal process at a maximum attainable temperature of 1200° C. and thereafter, dislocation etch pits do not occur even after the epitaxial silicon wafer is subjected to Wright etching.

3. A method of producing the epitaxial silicon wafer, according to claim 1, comprising:
growing a silicon single crystal by the Czochralski method so that a region within a radius of at least 150 mm from a center axis of the silicon single crystal is only a COP region and setting a time required to cool every part of the silicon single crystal from 800° C. down to 600° C. during growing to 450 minutes or less;
removing an OSF-ring region in an outer periphery of the silicon single crystal so that only the COP region remains in a radial direction of the silicon single crystal;
cutting a silicon wafer having a diameter of 300 mm or more from the silicon single crystal having the OSF-ring region removed; and
forming an epitaxial layer on a surface of the cut silicon wafer.

4. The method of producing the epitaxial silicon wafer, according to claim 3,
wherein forming the epitaxial layer comprises heating the silicon wafer so that oxygen precipitate nuclei are reduced.

* * * * *